(12) United States Patent
Pöppe et al.

(10) Patent No.: US 11,913,990 B2
(45) Date of Patent: Feb. 27, 2024

(54) AUTOMATED TEST EQUIPMENT FOR TESTING ONE OR MORE DEVICES UNDER TEST, METHOD FOR AUTOMATED TESTING OF ONE OR MORE DEVICES UNDER TEST, AND COMPUTER PROGRAM FOR HANDLING COMMAND ERRORS

(71) Applicant: Advantest Corporation, Tokyo (JP)

(72) Inventors: Olaf Pöppe, Tübingen (DE);
Klaus-Dieter Hilliges, Stuttgart (DE);
Alan Krech, Fort Collins, CO (US)

(73) Assignee: Advantest Corporation, Tokyo (JP)

( * ) Notice: Subject to any disclaimer, the term of this patent is extended or adjusted under 35 U.S.C. 154(b) by 664 days.

(21) Appl. No.: 17/094,129

(22) Filed: Nov. 10, 2020

(65) Prior Publication Data

US 2021/0073094 A1   Mar. 11, 2021

Related U.S. Application Data

(63) Continuation of application No. PCT/EP2020/051543, filed on Jan. 22, 2020.
(Continued)

(51) Int. Cl.
*G06F 11/07* (2006.01)
*G06F 11/30* (2006.01)
(Continued)

(52) U.S. Cl.
CPC ............... *G01R 31/318307* (2013.01); *G01R 31/3177* (2013.01); *G01R 31/31712* (2013.01);
(Continued)

(58) Field of Classification Search
CPC ...... G01R 31/318307; G01R 31/31712; G01R 31/31713; G01R 31/31724;
(Continued)

(56) References Cited

U.S. PATENT DOCUMENTS 5,103,450 A   4/1992   Whetsel
5,321,702 A   6/1994   Brown et al.
(Continued)

FOREIGN PATENT DOCUMENTS

CN       1925384 A     3/2007
CN     101310342 A    11/2008
(Continued)

*Primary Examiner* — Matthew M Kim
*Assistant Examiner* — Kyle Emanuele

(57) ABSTRACT

An automated test equipment for testing one or more devices under test, comprises at least one port processing unit, comprising a high-speed-input-output interface, HSIO, for connecting with at least one of the devices under test, a memory for storing data received by the port processing unit from one or more connected devices under test, and a streaming error detection block, configured to detect a command error in the received data, wherein the port processing unit is configured to, in response to detection of the command error, limit the storing in the memory of data following, in the received data, after the command which is detected to be erroneous. A method and computer program for automated testing of one or more devices under test are also described.

23 Claims, 4 Drawing Sheets

Related U.S. Application Data

(60) Provisional application No. 62/795,456, filed on Jan. 22, 2019.

(51) Int. Cl.
| | |
|---|---|
| *G01R 31/3183* | (2006.01) |
| *G01R 31/319* | (2006.01) |
| *G01R 31/317* | (2006.01) |
| *G01R 31/3177* | (2006.01) |
| *G06F 13/20* | (2006.01) |
| *G06F 11/273* | (2006.01) |

(52) U.S. Cl.
CPC .......... *G01R 31/31713* (2013.01); *G01R 31/31724* (2013.01); *G01R 31/31905* (2013.01); *G01R 31/31907* (2013.01); *G01R 31/31908* (2013.01); *G01R 31/31926* (2013.01); *G06F 11/2733* (2013.01); *G06F 13/20* (2013.01)

(58) Field of Classification Search
CPC .......... G01R 31/3177; G01R 31/31905; G01R 31/31907; G01R 31/31908; G01R 31/31926; G01R 31/318533; G01R 31/31935; G01R 31/31919; G06F 11/2733; G06F 13/20
See application file for complete search history.

(56) References Cited

U.S. PATENT DOCUMENTS

| | | |
|---|---|---|
| 6,424,926 B1 | 7/2002 | Mak |
| 6,460,152 B1 | 10/2002 | Demidov et al. |
| 7,562,271 B2 | 7/2009 | Shaeffer et al. |
| 9,026,869 B1 * | 5/2015 | Li .............. G06F 11/1016 714/718 |
| 10,161,993 B2 | 12/2018 | Frediani et al. |
| 2003/0009715 A1 | 1/2003 | Ricchetti et al. |
| 2004/0107395 A1 | 6/2004 | Volkerink et al. |
| 2005/0060600 A1 | 3/2005 | Jeddeloh |
| 2006/0156113 A1 | 7/2006 | Whetsel |
| 2008/0114562 A1 | 5/2008 | Sul et al. |
| 2008/0114563 A1 | 5/2008 | Kappauf et al. |
| 2010/0003837 A1 | 1/2010 | Loughner et al. |
| 2010/0023294 A1 | 1/2010 | Fan et al. |
| 2010/0312517 A1 | 12/2010 | McNamara et al. |
| 2011/0004793 A1 | 1/2011 | Sul et al. |
| 2011/0015891 A1 | 1/2011 | Kappauf et al. |
| 2011/0273197 A1 | 11/2011 | Banerjee et al. |
| 2012/0221285 A1 | 8/2012 | Conner |
| 2014/0114603 A1 | 4/2014 | Moon et al. |
| 2014/0236524 A1 | 8/2014 | Frediani et al. |
| 2014/0236525 A1 * | 8/2014 | Chan .............. G01R 31/31919 702/119 |
| 2014/0236526 A1 | 8/2014 | Frediani et al. |
| 2014/0237292 A1 | 8/2014 | Chan |
| 2014/0237305 A1 | 8/2014 | Rehmeyer et al. |
| 2014/0244204 A1 | 8/2014 | Frediani |
| 2015/0028908 A1 | 1/2015 | Kushnick et al. |
| 2018/0196103 A1 | 7/2018 | Champoux et al. |
| 2018/0275198 A1 | 9/2018 | Maekawa |
| 2018/0293786 A1 | 10/2018 | Insko et al. |

FOREIGN PATENT DOCUMENTS

| | | |
|---|---|---|
| CN | 105229481 A | 1/2016 |
| CN | 107430537 A | 12/2017 |
| IN | 1987236 A | 6/2007 |
| TW | 451379 B | 8/2001 |
| TW | 201337236 A | 9/2013 |
| TW | 201433802 A | 9/2014 |
| WO | 2007115235 A2 | 10/2007 |

* cited by examiner

AUTOMATED TEST EQUIPMENT FOR TESTING ONE OR MORE DEVICES UNDER TEST, METHOD FOR AUTOMATED TESTING OF ONE OR MORE DEVICES UNDER TEST, AND COMPUTER PROGRAM FOR HANDLING COMMAND ERRORS

CROSS-REFERENCE TO RELATED APPLICATIONS

This application is a continuation of co-pending International Application No. PCT/EP2020/051543, filed Jan. 22, 2020, and titled "Automated test equipment for testing one or more devices under test, Method for automated testing of one or more devices under test, and Computer Program for handling command errors" which is incorporated herein by reference in its entirety, which claims priority to U.S. Provisional Application 62/795,456 entitled "Testing Concepts, For Example For Onchip-System Test (OCST)," filed Jan. 22, 2019, and hereby incorporated by reference in its entirety.

TECHNICAL FIELD

Embodiments according to the present invention are related to an automated test equipment for testing one or more devices under test.

Further embodiments according to the present invention are related to a method for automated testing of one or more devices under test.

Further embodiments according to the invention are related to respective computer programs.

Embodiments according to the invention are related to testing of devices i.a. via a high-speed-input-output interface and with detection of errors in data received from the devices under test.

BACKGROUND OF THE INVENTION

In the following, an introduction into some conventional solutions will be provided.

Automated test equipment (ATE) is any apparatus that performs tests on a device, known as the device under test (DUT), using automation to quickly perform measurements and evaluate the test results. An ATE can be a simple computer-controlled digital multimeter, or a complicated system containing dozens of complex test instruments—real or simulated electronic test equipment—capable of automatically testing and diagnosing faults in sophisticated electronic packaged parts or on wafer testing, including system on chips and integrated circuits.

Structural tests enable systematic test coverage of individual structures, so-called cells, implementing the complex functions of a digital block within an System on a Chip, SOC.

Structural test includes a variety of test methods including, but not limited to Memory built-in self-test, BIST, Logic BIST (pattern generated on-chip) and Scan Test (pattern externally provided). Individual tests are combined to test blocks: e.g. scan test is hierarchically applied to blocks (serially or in parallel).

Advanced structural test methodologies apply a combination of externally provided test data (stimulus from Automated Test Equipment, ATE) and on-chip device for testing, DFT, that expands externally provided test data, so-called seeds, into scan chains. Test results are compacted and compressed into a reduced amount of test data provided to the primary input-output interface, IO, of a SOC. This data is called received data and is compared by the ATE with expected data. The received data can also be masked by the ATE.

The DFT, also sometimes called design for testing or design for testability typically consists of integrated circuit design techniques that add testability features to a hardware product design or device, i.e. the DUT. The added features make it easier to develop and apply tests to the DUT.

The following refers to Scan Test as general representation of structural test as described above.

However, there are challenges to cost-effectively scaling scan tests with the increasing complexity of SOCs enabled by new fabrication processes.

One challenge is the escalating amount of test data that needs to be stored on the ATE. Another challenge is the escalating test times to feed the test data through the SOC IO. Also the increasing on-chip complexity is challenging the distribution of test data to blocks-under-test and to create the required clock signals.

In addition, quality and reliability expectations of complex SOCs require structural tests when the SOC is deployed in the end-application: e.g. in automobile or communication infrastructure system.

In view of this situation, there is a desire for a concept which provides for an improved compromise between data to be stored, processing speed and quality and reliability of tests when testing devices under test with an automated test equipment.

SUMMARY OF THE INVENTION

An embodiment according to the present invention is an automated test equipment for testing one or more devices under test.

The automated test equipment comprises at least one port processing unit.

The at least one port processing unit comprises a high-speed-input-output, HSIO, interface for connecting with at least one of the devices under test, a memory for storing data received by the port processing unit from one or more connected devices under test, and a streaming error detection block, configured to detect a command error in the received data, e.g. in the data received from the one or more devices under test, for example from a scan chain.

HSIO interface refer to interfaces that are designed for high speed communication. A non-exhaustive list of examples is USB, PCIe, SATA, Gigabit LAN. Devices under test, DUTs, can e.g. be Systems-on-a-chip, SOCs.

Further, the port processing unit is configured to in response to detection of the command error, limit the storing in the memory of data following, in the received data, after the command which is detected to be erroneous. The limiting can also be considered a restriction. By limiting or restricting the storing of data, the requirement for storage for possibly useless and random payload data can be minimized. Such a restriction or limitation can be implemented as capturing the following bits as information payload on the state of the HSIO-Scan DFT block. By storing less data, processing power can be saved, since the following comparison or received data with expected data can be reduced. The restriction or limitation can be effected in such that a predetermined value indicates the amount of memory that may be used after an error is detected. The available amount of memory can also be indicated algorithmic. Finally, the amount of memory that may be used after an error is detected, can be dependent on the nature of the error, error type, error severity, or other characteristics.

This embodiment is based on the idea that testing a device under test generates data, which are transmitted to and received by the automated test equipment, ATE. The received data can, e.g. for evaluating the test, i.e. verification whether the received data is what would be expected to be transmitted by a properly working device under test, be further processed by the ATE. In order to further process the received data, it is helpful, at least in some embodiments, to store the received data in a memory of the ATE.

The data can be transmitted to the ATE using a high-speed-input-output interface, HSIO. The data can be structured such that the receiving portion can interpret the received data with less effort. One example for such a structure would be a data format comprising so-called command portions, which either indicate what follows, i.e. the payload, or which transmits actual commands to the other portion.

Since no only the payload can contain either transmission errors or contain errors which are the result of a malfunctioning of the device under test, but also these command errors can be faulty, an error in the command could possibly render the following payload useless, since it either cannot be identified correctly or not used according to the command, which should have been received. As an example, if the command is CONV, and the following data is meant to be converted consequently, an erroneous command CPNV cannot be interpreted correctly, and thus the payload is useless.

In case of an command error, it is thus the invention to restrict or limit the data that is saved into memory. The limitation can be zero, so that no data is saved after a faulty command, but can also be non-zero, in order to be able to provide data for debugging or error analysis.

In a preferred embodiment of the automated test equipment data following, in the received data, after the command which is detected to be erroneous, which is stored in the memory is exempted from further processing.

It has been found that if some data is stored after an erroneous command, this data can be stored and kept, but may be exempted from further processing, so that additional processing power can be saved.

In a preferred embodiment of the automated test equipment the limitation indicating the amount of data to be stored is defined by a fixed value, a variable value or a dynamic value.

It has been found that the amount of data can be predetermined to be the same for every error, thereby defining a fixed amount of data following an faulty command to be stored for analysis later-on. On the other hand, the amount may also be defined as a variable value, which can be defined as storing a different amount of data following an erroneous command at every occurrence of an erroneous command in dependence of certain parameters. Examples for such parameters can e.g. be the type of error, i.e. logic error (the command is at an illegal position in the data), transmission error (the received command is transmitted faulty), data mismatch (the payload does not match the command), checksum error (the command and/or payload have a checksum (or other integrity check) transmitted which is not correct), or any other commonly known error type. Another example for such a parameter is the type of the device under test and/or the type of the ATE. Other parameters can relate directly to an involved device, e.g. temperature, usage statistics, memory status, available memory, available CPU, and the like. Other parameters can refer to the payload, even whether the command is followed by payload at all, current time, transmission time, reception time, duration of transmission, etc. . . . . . Also, a dynamic value can be used, which changes over time.

In a preferred embodiment of the automated test equipment the streaming error detection block further compares the received data with pre-loaded expect data.

It has been found that in order to verify the correct functioning of the device under test, DUT, so-called expect data can be prepared and pre-loaded at the ATE. The received data can then be compared with the expect data and thus the correct functioning of the device can be determined. The received data can refer to data from the scan chain, command and/or payload data.

In a preferred embodiment of the automated test equipment the streaming error detection block further also detects payload data errors in the received data, and selectively stores data into the memory in response to the detection of an error in the received data.

It has been found that even if the command is correct, the ATE can detect an error in the payload, and avoid storing faulty payload data, which could be useless. Thereby also in case of a correct command, memory usage can be reduced if the payload contains an error.

In a preferred embodiment of the automated test equipment, the expect data can comprise mask data.

It has been found that thereby, by using mask data, i.e. data defining which bits of the received data are relevant and/or which bits of the received data are irrelevant for certain usages, the ATE can be enabled to process the data more intelligent. As an example, the expect data can contain mask data, which indicates that for a certain test procedure the received data will contain three blocks of data, the command indicating the pertinent test, the result data which was produced by the DUT and the seed data, which was used by the DUT to produce the result. Since the ATE supplied the DUT with the seed, storing of the seed might not be necessary in dependence of the test. By selectively storing the result data, additional memory space can be saved.

In a preferred embodiment of the automated test equipment, the ATE can further pre-load the expect data into a per-device first-in-first-out, FIFO, memory or a managed cache associated with one or more connected devices.

It has been found that the ATE can thus pre-load expect data into a first-in-first-out, FIFO, memory, for a device, and thereby have expect data prepared for a quicker comparison with the received data. This is particular beneficial, if the received data is expected to be in a certain order, such that the first pre-loaded, first-in, data will also be the first to be compared and thus can be discarded from the FIFO first, too, first-out. For this usage only a part of the expect data, a so-called window of expect data, can be pre-loaded.

Alternatively, a managed cache which can be associated with more than one DUT can be used to pre-load expect data, or a window of expect data, and then compared with the received data from more than one DUT. Thereby, the expect data does not have to be loaded, or pre-loaded repeatedly for all devices.

Also the FIFO or managed cache memory can track the usage, e.g. the comparison with the received data, from the associated connected DUTs and discard data which has been used, i.e. compared, or does not need to be retained anymore for another reason.

In a preferred embodiment of the automated test equipment, the ATE recognizes a certain device under test as failing in response to finding, on the basis of the tracking of data usage, that the certain device under test does not follow a data stream.

It has been found, that in response to finding that a certain device under test provides data so slowly that the expect data in the managed cache associated with the certain device under test remains unused much longer than corresponding expect data associated with other devices under test, the DUT can be recognized as failing.

If in the case of a managed cache, the corresponding retained expect data only is maintained in the memory for one out of several DUTs, the efficiency could be affected detrimentally, and by considering the DUT for which the particular expect data is retained as failing, the expect data can be discarded from the managed cache and the overall efficiency can be improved. Also, if it is expected that the received data follow a certain data stream, or pattern, and a DUT does not deliver the received data in that data stream or pattern, it could be considered to be failing.

In a preferred embodiment of the automated test equipment received data could be received as deterministic stream of bytes. In that case the received data and the pre-loaded expect data are compared in the order of the pre-loaded expect data. Alternatively, the received data could be received as data having associated an address information. Such address information could refer to the data being addressed by direct memory access, DMA. In that case, the received data are compared with the expect data at a memory address corresponding to the address information, wherein the memory address is an address of a memory storing the expect data.

It has been found that expect data can be processed serially, if the receive data are provided to the ATE as data stream in a predetermined order, a so-called deterministic data stream.

If, on the other hand, the data is provided in a non-deterministic manner, for example by memory addresses such as a direct memory access, DMA, addressing, the receive data is compared with the expect data by accessing the corresponding data at the memory address indicated by address information, that could be provided by the receive data, but could also be provided by the expect data or be predetermined.

In a preferred embodiment of the automated test equipment, the ATE stores data in the memory in a compressed representation.

It has been found that compressed data uses up less memory space. The ATE can, generally, store different parts of the full data sets, for example only the received data which deviates from expect data and/or the expect data for which the receive data is different, or data describing a deviation between the received data and the expect data. Some or all of the data stored in and/or by the ATE may be compressed to use up less memory space. The compression itself can be the same data compression method for all data that is to be stored compressed, but can also be different for different data command in dependence of certain parameters.

Examples for such parameters can e.g. be the type of test which is related to the data. Another example for such a parameter is the type of the device under test and/or the type of the ATE. Other parameters can relate directly to an involved device, e.g. temperature, usage statistics, memory status, available memory, available CPU, and the like. Other parameters can refer to the command or the payload, even whether the command is followed by payload at all, current time, transmission time, reception time, duration of transmission, etc. . . . . .

The compression used for part or all of the data can be lossless or lossy compression.

Examples for lossless compression types that can be used include entropy type, e.g. Arithmetic, Asymmetric numeral systems, Golomb, Huffman, Range, Shannon, Shannon-Fano, Shannon-Fano-Elias, Tunstall, Unary, Universal, e.g. Exp-Golomb, Fibonacci, Gamma, Levenshtein, dictionary type, e.g. Byte pair encoding, Lempel-Ziv, or other types, e.g. BWT, CTW, Delta, DMC, DPCM, LDCT, MTF, PAQ, PPM, RLE (run-length encoding, e.g. for failing bits).

Examples for lossy compression types that can be used include transform type, e.g. Discrete cosine transform, DST, FFT, Wavelet, predictive type, e.g. DPCM, LPC, Motion, Psychoacoustic.

Also combinations of compression methods can be used.

In a preferred embodiment of the automated test equipment, the ATE can dynamically adjust the compression to match an expected error distribution.

It has been found to be efficient, when the received data contains register values, which leads to short bursts of errors once a register value is wrong. This can be effectively stored by a header with the byte offset when the error burst starts and a word of errors extending to one register value.

In a preferred embodiment of the automated test equipment, the ATE can keep received data that are likely failing within proximity in the received data stream.

It has been found that in high speed communications, for example via a serial USB or other HSIO technology, related bits can be buffered in the DUT, e.g. by a DFT, to stream them out within a small region of serial bits. In case the HSIO is USB, this could be effected by the USB-DFT. For example the value of a MISR, which is received over several scan chains, could be buffered. Here, MISR is a Multi-Input Signature Register, also called Multi-Input Shift Register, which is a sequential electronic circuit whose structure is essentially a Linear Feedback Shift Register, LFSR, which has been modified so that an exclusive or, XOR, gate drives the input of one or more of the LFSR's flip-flops.

If this register fails, many bits will be flipped and accordingly a burst of failing bits can be stored with a single offset value of its beginning within the overall receive stream (see above). Similarly, the DFT could buffer and burst-out data from an individual scan-chain. Also, the DFT may keep results of a single block coming from several scan chains buffered and burst those out separately from the results of another block.

In a preferred embodiment of the automated test equipment, the streaming error detection block further stores statistical information that is relevant to the analysis of failure.

It has been found that storing statistical information is beneficial for the evaluation of possibly occurring errors. Examples of such statistical information are counting the total number of failures, possibly by type as detailed above, and/or storing the byte-offset of the first failing cycle.

In a preferred embodiment of the automated test equipment, the ATE further detects the command error in response to noticing that the device under test has broken a command sequence or to noticing that the command sequence has broken.

It has been found that the DUT can intentionally, e.g. in response to detection of an abnormality, break the command sequence in order to indicate the existence of the abnormality. Such an abnormality can be based in the test, the DUT but also the ATE. Also the ATE can notice that the command sequence has broken for some other reason, e.g. due to a failure of the HSIO DFT, which typically invalidates all the payload.

In a preferred embodiment of the automated test equipment, the expect data comprises command expect data bits indicating whether corresponding received data bits are a command or payload data.

It has been found that expect data indicating expected command sequences in the receive data can be beneficial in the determination of errors and the processing requirements for the receive data. The expect data could comprise command-flag data.

In a preferred embodiment of the automated test equipment, the expect data comprises mask data, indicating which bits of the received data are expected to be command bits.

It has been found that, alternatively, the command sequences in the receive data can be identified by using mask data, which can be comprised in the corresponding expect data.

In a preferred embodiment of the automated test equipment, the ATE sets a command error flag in response to detection of the command error.

It has been found that setting or raising a flag, here a command error flag, when a command error is detected, the detection of unexpected process issues is speed up.

In a preferred embodiment of the automated test equipment, mapping information is stored in the memory, and the port processing unit further descrambles the data on the basis of the mapping information, in order to obtain error information which directly refers to offsets of the stored data.

It has been found that mapping information, which e.g. is information used for descrambling the results of a test, can be used to descramble the data, e.g. low-level payload data of the HSIO, in order to obtain error information, e.g. an error map, which directly refers to offsets of the stored data. Thereby the errors that occurred can be identified and later-on retrieved with less effort. One example thereof in context with a block-IO is that the error information refers to offsets into a scan-chain.

Alternatively, the mapping information are not stored in the memory of the ATE, but are comprises in the command expect data.

In a preferred embodiment of the automated test equipment, the mapping information may be different for each device under test, and the port processing unit further detects the payload type prior to descrambling.

It has been found that the mapping information might be different in dependence of e.g. the device under test, i.e. mapping and descrambling of result data can be optimized for different DUTs, e.g. different SOC-Blocks, if the corresponding mapping information to obtain error information is adapted to the DUT. Further it is beneficial if the ATE, i.e. the PPU, detects the payload type, which might be stored in a block index of a command, but can also be determined by the ATE without additional information, prior to descrambling, since the resulting error information, i.e. the error map, can then be obtained in dependence of the payload type and thus be optimized in this regard, e.g. how each bit in the payload maps to scan-chains, and this can possibly be repeated for a long burst of payload.

In a preferred embodiment of the automated test equipment, the port processing unit further discards command data prior to detecting the payload type.

It has been found that discarding of data that is identified to be command data before detecting the type of the payload can increase processing speed of the descrambling. The command data can also be discarded selectively, discarding some command data, e.g. of first half of data, or command data of a certain type, and retaining some command data.

An embodiment comprises a method for automated testing of one or more devices under test, comprising receiving data, via a high-speed-input-output, HSIO, interface connecting a port processing unit with at least one of the devices under test, storing, data received from connected devices under test in a memory, detecting of a command error in the received data stored in the memory, in response to detection of the command error, limiting the storing in the memory of data following, in the received data, after the command which is detected to be erroneous.

This method is based on the same considerations as the above-described automated test equipment. However, it should be noted that the method can be supplemented by any of the features, functionalities and details described herein, also with respect to the automated test equipment. Moreover, the method can be supplemented by the features, functionalities, and details of the automated test equipment, both individually and taken in combination.

An embodiment according to the invention creates a computer program for performing the method described herein, when the computer program runs on a computer.

BRIEF DESCRIPTION OF THE FIGURES

Embodiments according to the present invention will subsequently be described taking reference to the enclosed figures in which.

In the figures, similar reference signs denote similar elements and features.

DETAILED DESCRIPTION OF THE EMBODIMENTS

Figure 1:
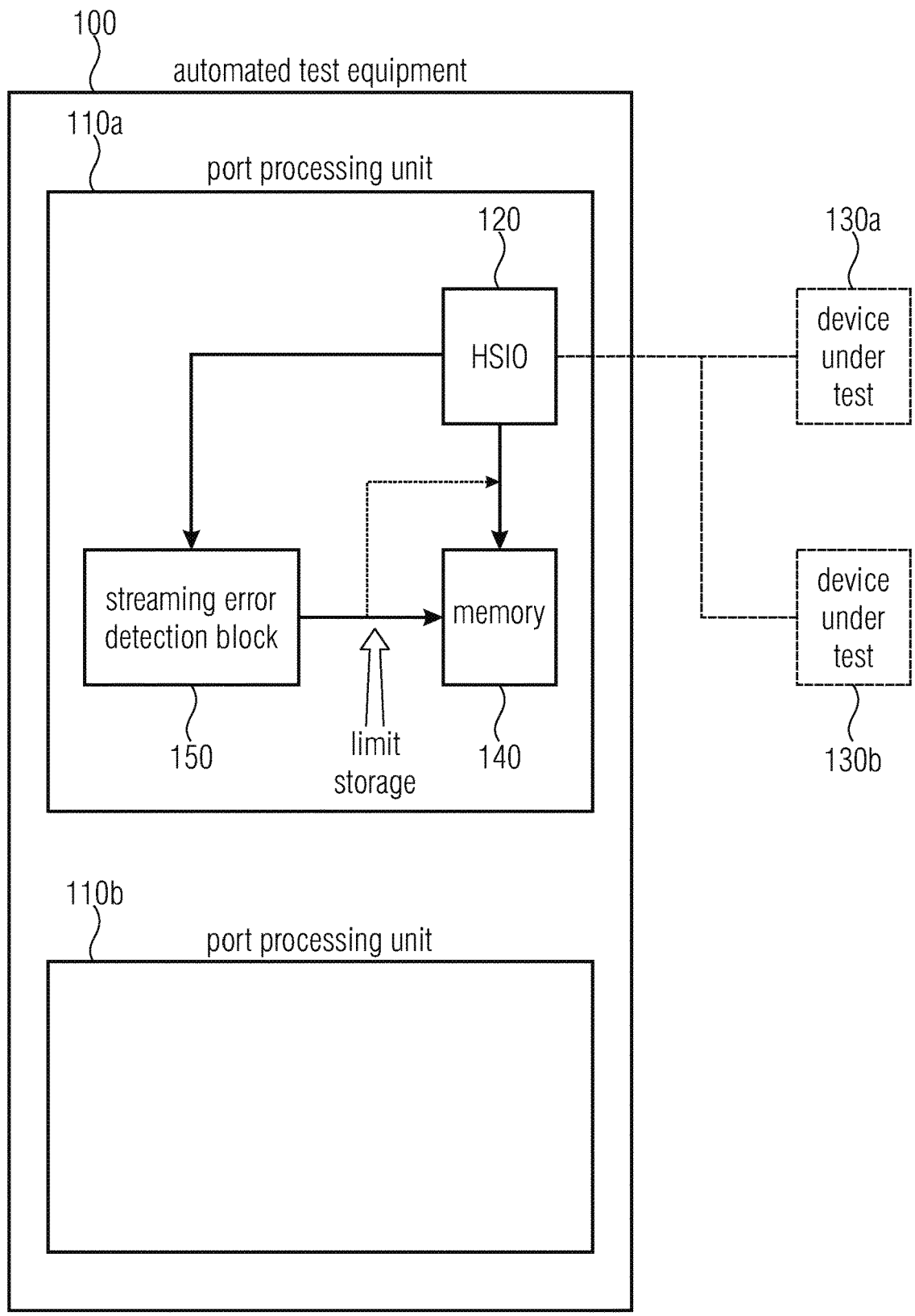
FIG. 1 shows a block schematic diagram of an automated test equipment according to an embodiment of the present invention.

FIG. 1 shows a block schematic diagram of an automated test equipment 100 according to an embodiment of the present invention. The automated test equipment, ATE, is for testing one or more devices under test, DUTs 130. The automated test equipment 100 comprises at least one port processing unit, PPU 110, which comprise a memory 140, and a high-speed-input-output, HSIO, interface 120 for connecting with one or more devices under test 130. Alternatively, the PPU 100 can comprise more than one HSIO interface 120, such that each device under test 130 that is connected to the PPU is coupled via a dedicated HSIO interface 120.

The DUTs are tested, e.g. by providing them with test data, and receiving from them test results in various ways. The PPU can receive this test data from an entity within the ATE or from the outside of the ATE, e.g. a data store (not shown). The PPU then can store the received data in the memory and provide the data to the DUTs via the one or more HSIO interface.

Testing a device under test requires data transmission in both directions between the ATE and the DUTs. Some of these transmissions are transmitted via the HSIO.

The port processing units 110 further comprises a streaming error detection block 150, for detecting a command error in the data received from the one or more DUTs 130.

The received data comprises command sequences and payload. The data received from the DUTs contains result data which is the result of the testing on the DUT 130. If the streaming error detection block detects an error in the command sequences of the received result data, one possibility is that the test is flawed and therefore the storing of the result data might not be useful. Therefore, the PPU can limit the storing of the result data with the erroneous command sequence in order to save memory space.

Even further, the PPU can also store the limited data which is saved, e.g. for failure analysis, exempt from further processing, wherein the further processing refers to the procedural steps which would be exercised on data which does not contain any error, e.g. comparing the received data with expect data, such that it can be determined whether the device under test passed the test.

For certain data, e.g. data which is accompanied by an erroneous command, such a comparison does not produce any meaningful result, and therefore exempting the data that is stored, even if limited, after an erroneous command can be beneficial to the overall performance of a PPU and thus the ATE.

The limitation of the data to be stored after an erroneous command, i.e. indicating the amount of data to be stored, can be defined as a fixed value, a variable value or a dynamic value. It could be useful to store the same amount of data for every error, thereby defining a fixed amount of data following an faulty command to be stored for analysis later-on. On the other hand, the amount may also be defined to be as a variable value, which can be defined as storing a different amount of data following an erroneous command at every occurrence of an erroneous command in dependence of certain parameters. Examples for such parameters can e.g. be the type of error, i.e. logic error (the command is at an illegal position in the data), transmission error (the received command is transmitted faulty), data mismatch (the payload does not match the command), checksum error (the command and/or payload have a checksum (or other integrity check) transmitted which is not correct), or any other commonly known error type. Another example for such a parameter is the type of the device under test and/or the type of the ATE. Other parameters can relate directly to an involved device, e.g. temperature, usage statistics, memory status, available memory, available CPU, and the like. Other parameters can refer to the payload, even whether the command is followed by payload at all, current time, transmission time, reception time, duration of transmission, etc. . . . . A dynamic value can also be used, which can change over time on the basis of above parameters.

As noted above, the streaming error detection block can further compare the received data with pre-loaded expect data, in order to verify the correct functioning of the device under test, DUT. Therefor the so-called expect data can be prepared and pre-loaded at the ATE. The received data can then be compared with the expect data and thus the correct functioning of the device can be determined. The received data can refer to data from the scan chain, command and/or payload data.

The streaming error detection block can also detect payload data errors in the received data, and selectively stores data into the memory in response to the detection of an error in the received data. Again, since storing faulty data, e.g. here payload data, could be useless an error in the payload can be detected and its storing avoided in order to save memory space. Thereby also in case of a correct command, memory usage can be reduced if the payload contains an error. Selectively can also mean, that in dependence of the error and/or payload or other parameters, no data is stored at all.

The expect data can also comprise mask data, i.e. data defining which bits of the received data are relevant and/or which bits of the received data are irrelevant for certain usages. With using mask data, the ATE can be enabled to process the data more intelligent. As an example, the expect data can contain mask data, which indicates that for a certain test procedure the received data will contain three blocks of data, the command indicating the pertinent test, the result data which was produced by the DUT and the seed data, which was used by the DUT to produce the result. Since the ATE supplied the DUT with the seed, storing of the seed might not be necessary in dependence of the test. By selectively storing the result data, additional memory space can be saved.

The received data could be received as deterministic stream of bytes or in a non-deterministic manner. If the received data is received as deterministic stream, the received data and the pre-loaded expect data are compared in the order of the pre-loaded expect data. Alternatively, the received data could be received as data having associated an address information. Such address information could refer to the data being addressed by direct memory access, DMA. In that case, the received data are compared with the expect data at a memory address corresponding to the address information, wherein the memory address is an address of a memory storing the expect data. The expect data can be processed serially, if the receive data are provided to the ATE as data stream in a predetermined order, a so-called deterministic data stream.

If the received data is provided in a non-deterministic manner, for example by memory addresses such as a direct memory access, DMA, addressing, the receive data is compared with the expect data by accessing the corresponding data at the memory address indicated by address information, that could be provided by the receive data, but could also be provided by the expect data or be predetermined.

The expect data can also be pre-loaded, e.g. into a per-device first-in-first-out, FIFO, memory or a managed cache associated with one or more connected devices. Thereby, the expect data can be held ready for a quicker comparison with the received data. This is particular beneficial, if the received data is expected to be in a certain order, such that the first pre-loaded, first-in, data will also be the first to be compared and thus can be discarded from the FIFO first, too, first-out. For this usage only a part of the expect data, a so-called window of expect data, can be pre-loaded.

Alternatively, a managed cache which can be associated with more than one DUT can be used to pre-load expect data, or a window of expect data, and then compared with the received data from more than one DUT. Thereby, the expect data does not have to be loaded, or pre-loaded repeatedly for all devices.

The expect data can be loaded from a data store (not shown), which is connected to the PPUs 110, which can also be connected to each other in form of a daisy chain. The data store can be or comprise a shared memory pool. The PPUs 110 can then receive data directly from the data store. The data store can be an internal element of the ATE 100, but can also be an associated element outside of the ATE 100. The PPUs receive data, which can be shared, from the data store and/or the shared memory pool, respectively.

The data can be shared between port processing units, that means that the data which is shared between a plurality of port processing units can be received by the PPUs from the data store.

The data store can stream shared data to one or more of the port processing units 110, and the data store can store per-device, i.e. per-DUT, result data, e.g. results or result streams, into a plurality of memory areas. In particular these memory areas can be functionally and/or technically different. Thereby, the PPUs provide the results to the data store and since the data rates of the per-DUT result data may be different from each other, e.g. smaller, for example, at least by a factor of ten, than the data rate of another result or result stream, it might be beneficial to store the results, in dependence of their particular characteristics into different memory areas. Also, the volume and bandwidth required for storing results is significantly smaller than for shared stimulus data, therefore these might also be stored into different memory areas.

The port processing units, PPUs 110, can further forward shared data from the shared memory pool to at least one other port processing unit. In the embodiment, where the PPUs are connected to each other, or at least with one other PPU, the PPUs can forward the data to the other PPUs, or at least one other PPU. Thereby the memory accesses, i.e. read and write, from the PPUs to the data store are reduced.

Likewise, the PPUs 110, can receive shared data from the shared memory pool from at least one other port processing unit. In the embodiment, where the PPUs are connected to each other, or at least with one other PPU, the PPUs can receive the data from the other PPUs, or at least one other PPU. Thereby the memory accesses, i.e. read and write, from the PPUs to the data store 150 are reduced, too.

A particular form of the above detailed connection of the PPUs is a daisy chain, where each PPU is connected to two other PPUs, such that a series of PPUs is achieved, and the first PPU is connected to the data store.

Other topologies are possible as well, e.g. mesh, star, fully connected, line, tree, bus. The first and last PPU might be connected to each other, too, such that a ring is formed, but they may also not be connected to each other, such that a series of PPUs is formed (true daisy chain). Each PPU might be connected with the data store.

Alternatively, between the data store and the PPUs, a memory hub (not shown) can be comprised. The data store can stream shared data to a memory hub, from where the shared data can be transmitted to the PPUs 110. The memory hub can enhance the overall efficiency of the ATE 100.

PPUs 110 can receive the shared data from the memory hub. If the memory hub serves more than one PPU 110 with shared data, it could also be considered to be a central memory hub. Other topologies are also possible, as discussed above.

Also the FIFO or managed cache memory can track the usage, e.g. the comparison with the received data, from the associated connected DUTs and discard data which has been used, i.e. compared, or does not need to be retained anymore for another reason.

The ATE can recognize a certain device under test as failing in response to finding, on the basis of the tracking of data usage, that the certain device under test does not follow a data stream. That is, if a certain device under test provides data so slowly that the expect data in the managed cache associated with the certain device under test remains unused much longer than corresponding expect data associated with other devices under test, the DUT can be recognized as failing.

If in the case of a managed cache, the corresponding retained expect data only is maintained in the memory for one out of several DUTs, the efficiency could be affected detrimentally, and by considering the DUT for which the particular expect data is retained as failing, the expect data can be discarded from the managed cache and the overall efficiency can be improved. Also, if it is expected that the received data follow a certain data stream, or pattern, and a DUT does not deliver the received data in that data stream or pattern, it could be considered to be failing.

Figure 2:
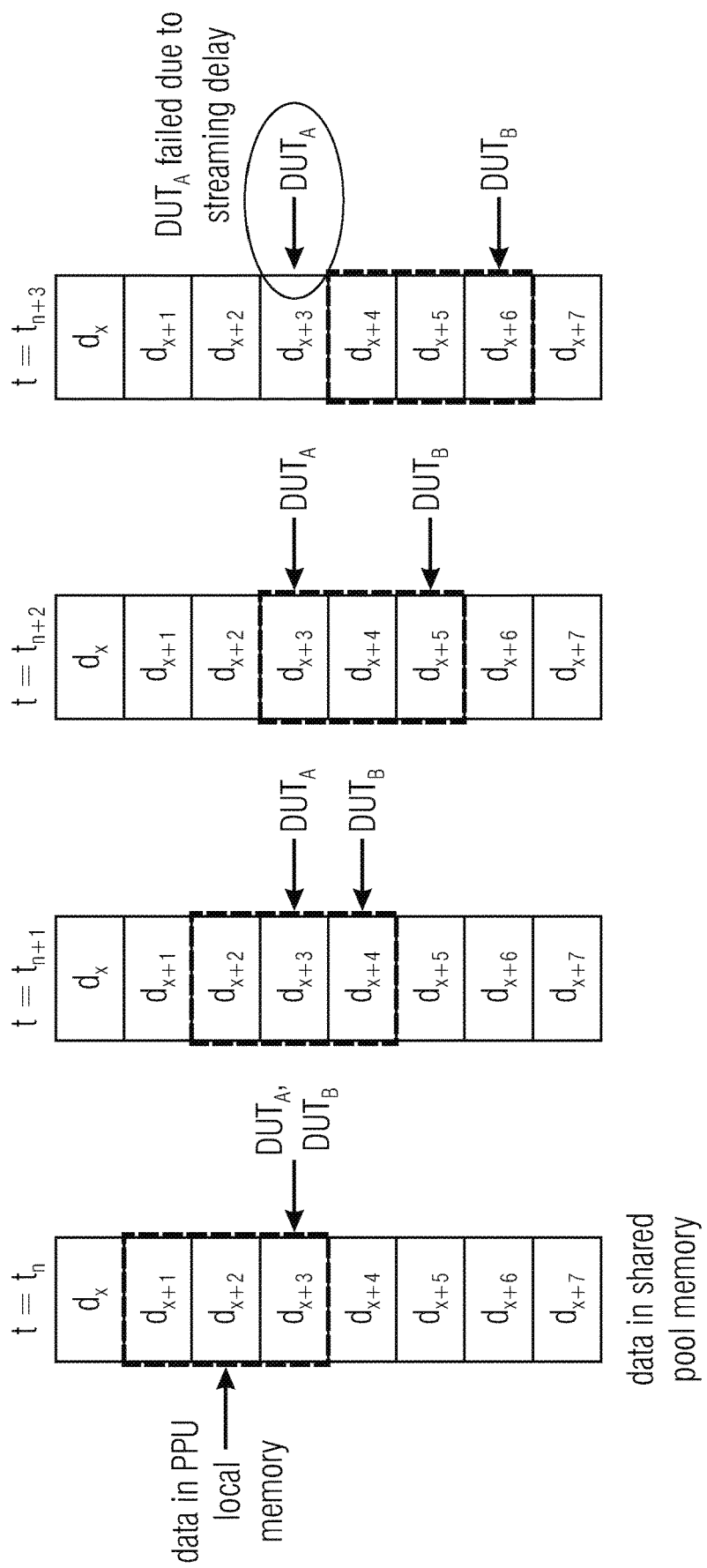
FIG. 2 shows a block schematic diagram of data structures indicating that a device under test is failing.

This is also shown in FIG. 2. Thereon, data elements $d_x$ to $d_{x+7}$ are expect data that are stored at a data store, or memory hub, as detailed above. Corresponding three elements have been preloaded into memory 140 of the PPU and are held available there for comparison.

At the respective points of time $t_n$, $t_{n+1}$, $t_{n+2}$, and $t_{n+3}$ these are $d_{x+1}$, $d_{x+2}$, and $d_{x+3}$; $d_{x+2}$, $d_{x+3}$, and $d_{x+4}$; $d_{x+3}$, $d_{x+4}$, and $d_{x+5}$; and $d_{x+4}$, $d_{x+5}$, and $d_{x+6}$, respectively.

At $t=t_n$ PPU 110 $d_{x+1}$, $d_{x+2}$, and $d_{x+3}$ available in local memory 140 for comparison. PPU 110 receives $d_{x+3}$ as well from $DUT_A$ and $DUT_B$, which are two of the DUTs 130.

Then $d_{x+1}$ is discarded from the memory, and $d_{x+4}$ is loaded into the now available memory space of memory 140. PPU 110 now has $d_{x+2}$, $d_{x+3}$, and $d_{x+4}$ in the memory 140. At $t=t_{n+1}$, $DUT_B$ transmits $d_{x+4}$, but $DUT_A$ still is transmitting $d_{x+3}$.

Then $d_{x+2}$ is discarded from the memory, and $d_{x+5}$ is loaded into the now available memory space of memory 140. PPU 110 now has $d_{x+3}$, $d_{x+4}$, and $d_{x+5}$ in the memory 140. At $t=t_{n+2}$, $DUT_B$ transmits $d_{x+5}$, but $DUT_A$ still is transmitting $d_{x+3}$.

Then $d_{x+3}$ is discarded from the memory, and $d_{x+6}$ is loaded into the now available memory space of memory 140. PPU 110 now has $d_{x+4}$, $d_{x+5}$, and $d_{x+6}$ in the memory 140. At $t=t_{n+3}$, $DUT_B$ transmits $d_{x+6}$, but $DUT_A$ still is transmitting $d_{x+3}$. Since the transmission of $DUT_A$ cannot be compared anymore without re-loading $d_{x+3}$, $DUT_A$ can alternatively be considered failing, such that the progression of $DUT_B$, which can be more than one device, is not delayed.

As detailed in the summary, the data can also be stored in a compressed representation. This of course, refers to all memories and all data. And the compression can be dynamically adjusted. For example to match an expected error distribution.

The ATE can also keep received data that are likely failing within proximity in the received data stream, as discussed above.

The streaming error detection block can further store statistical information that is relevant to the analysis of failure.

The ATE can further detect a command error in response to noticing that the device under test has broken a command sequence, which the DUT can do intentionally, e.g. in response to detection of an abnormality, in order to indicate the existence of the abnormality. Such an abnormality can be based in the test, the DUT but also the ATE.

Also the ATE can notice that the command sequence has broken for some other reason, e.g. due to a failure of the HSIO DFT, which typically invalidates all the payload.

Figure 3:
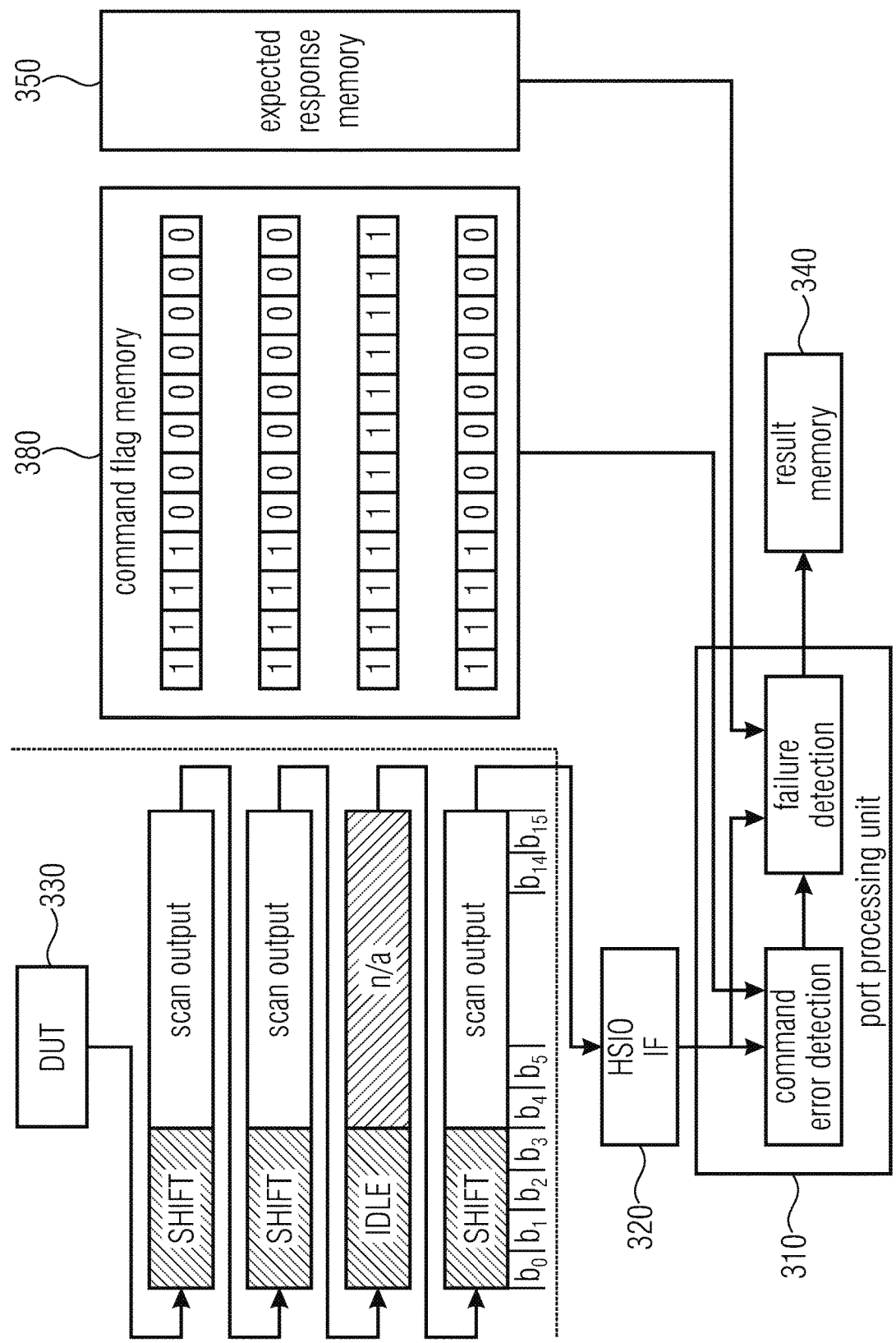
FIG. 3 shows a block schematic diagram of data flow and data structures regarding command flags.

The expect data can comprise command expect data bits indicating whether corresponding received data bits are a command or payload data, thereby facilitating the determination of errors and the processing requirements for the receive data. The expect data could e.g. comprise command-flag data. Further the expect data can comprise mask data, indicating which bits of the received data are expected to be command bits. Such a command flag structure, wherein a mask is shown in command flag memory 380 is depicted in FIG. 3, where it is shown as an individual memory, but it could, as discussed above be also a part of the expect data, which is stored in the expected response memory 350, which can e.g. be or be comprised by the data store 350. In the command flag memory, which matches the data output from the DUT 330, the value 1 indicates that corresponding bits of the output data are part of a command. The value 0 indicates that the corresponding bits of the output data are not part of a command, and are thus e.g. payload. In certain cases, the value 1 can also be used to indicate simply non-payload data, and therefore the block used for the IDLE command has corresponding bits of value 1 in the command flag memory for the command itself (i.e. the first 4 bits) and the following 8 bits, which are neither command nor payload.

Further, the ATE can set a command error flag in response to detection of the command error, whereby the detection of unexpected process issues is speed up.

In the ATE 100, mapping information can further be stored, e.g. in the memory 140. The port processing unit 110 can descramble the data on the basis of the mapping information, in order to obtain error information which directly refers to offsets of the stored data. This mapping information can be information used for descrambling the results of a test, i.e. the data returned from the DUTs, which are considered to be result data of one or more tests, can be descrambled. An examples of the data is e.g. low-level payload data of the HSIO. By descrambling, error information, e.g. an error map, can be obtained, which directly refers to offsets of the stored data. Thereby the errors that occurred can be identified and later-on retrieved with less effort. One example thereof in context with a block-IO is that the error information refers to offsets into a scan-chain.

However, the mapping information do not have to be stored in the memory 140 directly, but can be part of the command expect data. Also, the mapping information may be different for each device under test 130, and the port processing unit 110 detects the payload type prior to descrambling, in order to use the correct mapping information.

The mapping information can be different in dependence of the device under test for various reasons. As an example, the mapping and descrambling of result data can be optimized for different DUTs, e.g. different SOC-Blocks, if the corresponding mapping information to obtain error information is adapted to the DUT. Further it is beneficial if the ATE, i.e. the PPU, detects the payload type, which might be stored in a block index of a command, but can also be determined by the ATE without additional information, prior to descrambling, since the resulting error information, i.e. the error map, can then be obtained in dependence of the payload type and thus be optimized in this regard, e.g. how each bit in the payload maps to scan-chains, and this can possibly be repeated for a long burst of payload.

The PPU 110 further can discard command data prior to detecting the payload type, if for example it is determined or pre-set that only the payload needs to be processed further, then, discarding of data that is identified to be command data before detecting the type of the payload can increase processing speed of the descrambling. The command data can also be discarded selectively, discarding some command data, e.g. of first half of data, or command data of a certain type, and retaining some command data.

It is noted that the ATE 100 can optionally be supplemented by any of the features, functionalities and details described herein, both individually and taken in combination.

An embodiment comprises a method for automated testing of one or more devices under test, comprising receiving data, via a high-speed-input-output, HSIO, interface connecting a port processing unit with at least one of the devices under test, storing, data received from connected devices under test in a memory, detecting of a command error in the received data stored in the memory, in response to detection of the command error, limiting the storing in the memory of data following, in the received data, after the command which is detected to be erroneous.

This method is based on the same considerations as the above-described automated test equipment. However, it should be noted that the method can be supplemented by any of the features, functionalities and details described herein, also with respect to the automated test equipment. Moreover, the method can be supplemented by the features, functionalities, and details of the automated test equipment, both individually and taken in combination.

An embodiment according to the invention creates a computer program for performing the method described herein, when the computer program runs on a computer.

Details and Embodiments

In the following, some considerations underlying the present invention will be discussed and several solutions will be described. In particular, a number of details will be disclosed, which can optionally be introduced into any of the embodiments disclosed herein.

Motivation

Structural test enables systematic test coverage of individual structures ("cells") implementing the complex functions of a digital block within an SOC [System on a Chip]. Structural test includes a variety of test methods including, but not limited to Memory BIST, Logic BIST (pattern generated on-chip) and Scan Test (pattern externally provided). Individual tests are combined to test blocks: e.g. scan test is hierarchically applied to blocks (serially or in parallel).

Advanced structural test methodologies apply a combination of externally provided test data (stimulus from ATE [Automated Test Equipment]) and on-chip DFT [device for testing] that expands externally provided test data (seeds) into scan chains. Test results are compacted and compressed into a reduced amount of test data provided to the primary IO of a SOC (receive data) that the ATE compares with expected data (including the ability to mask receive data).

Without limiting the application of the proposed solution the following refers to Scan Test as general representation of structural test as described above.

However, there are challenges to cost-effectively scaling scan tests with the increasing complexity of SOCs enabled by new fabrication processes.

Escalating amount of test data that needs to be stored on the ATE

Escalating test times to feed the test data through the SOC IO

Increasing on-chip complexity challenging the distribution of test data to blocks-under-test and to create the required clock signals.

In addition, quality and reliability expectations of complex SOCs require structural test when the SOC is deployed in the end-application: e.g. in automobile or communication infrastructure system.

Several possible solutions to these challenges include:

Test Data Delivery through functional high-speed I/O interfaces: e.g. through USB or PCIe. This leads to the following:
- Enables increased data rates
- Enables structural test in the end-application
- Requires decoupling of timing on ATE and on DUT [Device under testing] (as is typical for HSIO data comm's). Any accurate timing synchronization will require timing-sensitive signals between the DUT and ATE or other auxiliary equipment (e.g. oscilloscope).

Advanced on-chip test data processing, test scheduling and test data communication with blocks-under-test.
Typical elements proposed:
- A communication protocol between the ATE and the HSIO-DFT: e.g. 1149.10
- Using a network-on-chip (NOC) to flexibly route test data with local DFT managing the test application
- Flexible test scheduling serially or in parallel for several blocks.

This leads to the following:
- Requires complex interactions to effectively schedule test data transfer to and from the DUT
- Enables higher-level communication (semantics) transferred over the test port offering new levels of control: e.g.
  - DFT providing pre-processed results that eases decision making and yield learning.
  - DFT controlling ATE power Aspect 1: Solution for Multi-Site Data Sharing, Data Streaming, Data Processing Issue: The escalating test data volume demands sharing test data across multiple sites tested in parallel:
- Various types of data could be shared and need to be streamed from a shared data storage to the DUT interface ("port") or per-site processing units. Data that could be shared include the following but are not limited to:
  - Drive Data (Stimulus),
  - Expect Data (including Mask Data stored with Expect Data or in a separate memory region),
  - Auxiliary Data needed for post-processing results
- Data flow needs to keep up with the HSIO data rate minimizing impact on the resulting per-site test data transfer.
- Ideally, data storage could be shared across all sites interfacing to the ATE's Port-Processing-Units. However, this would lead to prohibitively complex and expensive data interfaces. An appropriate architecture needs to be found to max. sharing without test execution impact.
- Per-site data cannot be shared. These include:
  - Receive Data from the DUT
  - Results stored after comparing the Receive Data with the Expect Data
  - Per-Site Test Conditions: e.g. DUT-specific on-chip setup communicated to the DUT as preamble to the actual test data transfer.

Figure 4:
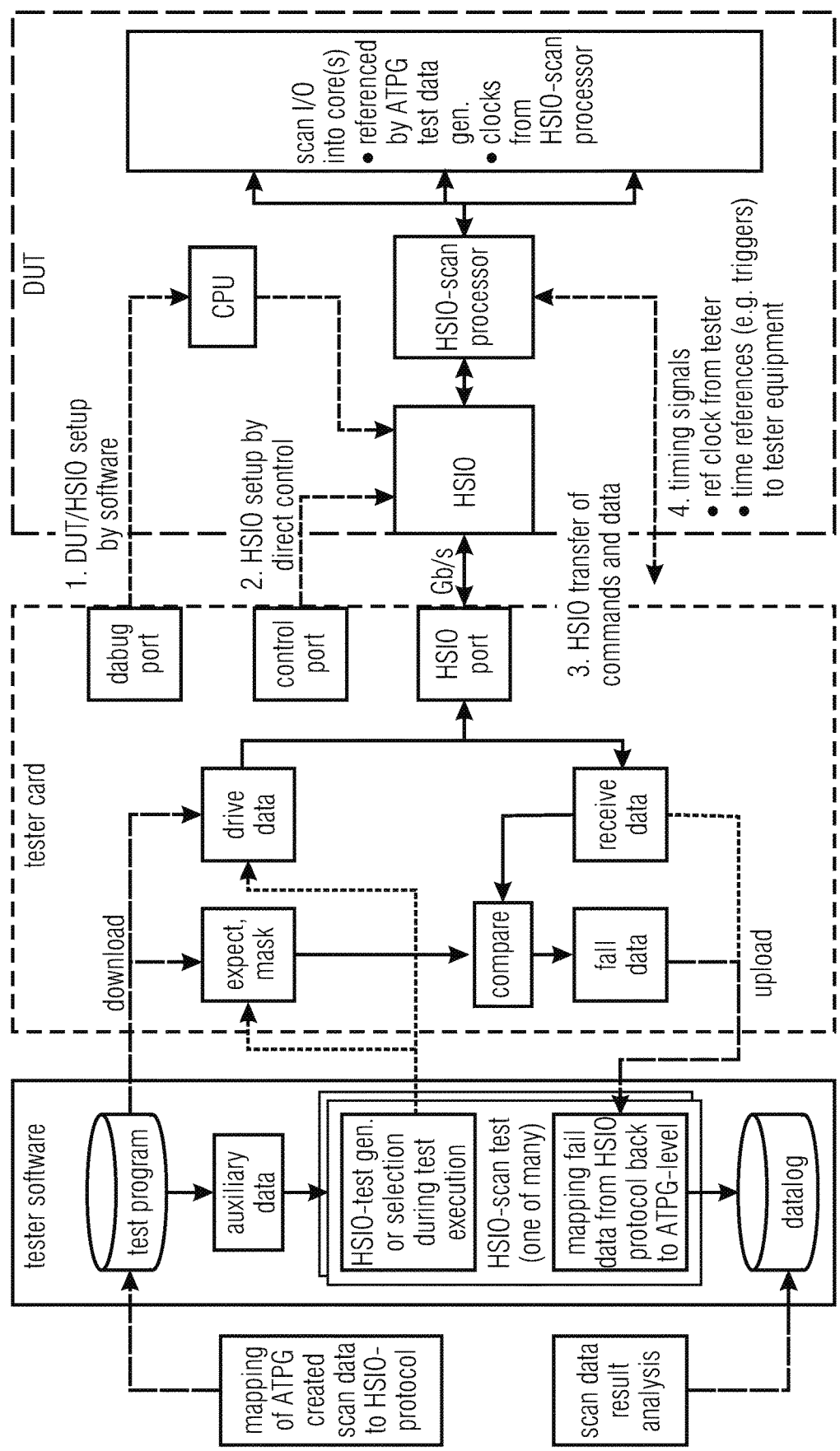
FIG. 4 shows a block schematic diagram of an exemplary automated test equipment according to another embodiment of the present invention including data flows.

Solution:

FIG. 4 shows an exemplary data flow. However, it only represents a single site and does not distinguish the data store from the one or more port-processing units (PPU).

Solution Components:
1. Data Store:
   - Memory subsystem on the ATE hardware implementing a large, shared pool of memory
   - Typically, implemented as the fastest commodity RAM available.
   - Used to stream shared data to the port-processing units. To minimize bandwidth utilization data shared for a multi-site test execution are preferably only read once by either a PPU or a memory hub.
   - Used to store per-DUT result streams into controlled memory areas. The volume and bandwidth required for storing results is preferably significantly smaller than for shared stimulus data.
   - There may be one or more data stores on an ATE card. Each data store requires a replication of the data flow architecture.
2. PPU—Port Processing Unit:
   - Interfaces with one or many DUTs
   - Implements HSIO, debug and control ports for DUTs
   - Receives data from data store either directly or forwarded from another PPU (daisy-chain) or central memory hub.
   - It uses buffering (FIFOs) and caches to minimize read-accesses to its data source.
   - It gracefully handles failing respectively slow sites: E.g. User can specify a max. processing disparity indicating a devices is failing if is falls more than this number behind Receive.
   - May forward shared data to one or more other PPUs
   - Implements the per-DUT compare of Expect Data with Receive Data and calculates per-DUT Fail Data
   - Sends Fail Data to the Data Store—potentially, through another PPU or Memory Hub.
3. Memory Hub (optionally):
   - It is used to implement a star architecture.
   - It offers data interfaces for each PPU
   - It uses buffering (FIFOs) and caches to minimize read-accesses to the data store.
4. Result Data Store(s) (optionally):
   - Independent data stores for results may be attached to each PPU or centrally to a memory hub for the following reasons:
   - It offers a memory interface that is independent of the interface used to stream shared data to the PPUs
   - It offers a memory interface to access result data for post-processing or uploading without interfering with the next test execution.

Aspect 2: Solution for Streaming Error Detection and Failure Compression

Issue: Traditional ATE in real-time samples the primary outputs from the structural tests and compares it with expect data (incl.) masking. This process is enabled by a deterministic, cyclical I/O of test data.

However, scan test through HSIO is inherently non-deterministic and bursted. Also, the scan output is payload data in a protocol stack: i.e. the data going to/from the scan chains are scrambled into a serial payload "tagged" with commands. USB receive data (commands and payloads) is stored in memory before it is processed: e.g. compared with expect data.

This approach has two problems:
1. The data processing has significant memory bandwidth requirements in storing received data and later reading it again to compare it with expected data stored on another memory location. This is further multiplied by testing several devices in parallel
2. The decision whether a scan pattern has failed is based on post-processing the data received through USB-packets. Worst case the comparing of received data with expect data dominates the overall execution time: i.e. it takes longer than the data streaming through the HSIO Solution:

A streaming error detection block embedded in the port-processing unit that compares just-received scan data with pre-loaded expect data to only write to memory when an actual error was detected. Note that expect data may include mask data.

In detail:
1. Using the data streaming architecture described above, a port-processing unit keeps a window of expect data available for comparing it with received data packets.
   The expect data are pre-loaded in a per-site FIFO or a managed cache that tracks the use of its data by all active sites before discarding the data. This avoids reading the expect data from the large data store—possibly, repeatedly for each site.
   In case a device does not follow the data stream, the PPU may raise an exception, declare the site as failing and store only the available error data.
2. On receiving scan data on the HSIO, the port processing unit compares the received data with the "matching" pre-loaded expect data.
   In case of HSIO communication as a deterministic stream of bytes, "matching" refers to comparing received data in the order of the pre-loaded expect data.
   In case of a DMA transfer of received data, the PPU matches the byte offset of the receive data written with the byte offset in the expect data. The byte offset acts like a memory address.
3. The error information is streamed out in a compressed representation to minimize data volume and memory interface bandwidth required. Beyond standard data compression (e.g. run-length encoding of failing bits), the streaming error detection block may implement test specific formats (e.g. as delivered by traditional ATE as well).
   The compression may dynamically be adjusted to match the expected error distribution: e.g. the received data may contain register values, which leads to short bursts of errors once a register value is wrong. This can be effectively stored by a header with the byte offset when the error burst starts and a word of errors extending to one register value.
   The compression of result data can be improved if the USB-DFT keeps receive data that are likely failing within proximity in the serial USB receive data stream. The USB-DFT could buffer related bits to stream them out within a small region of serial bits: e.g. buffer the value of a MISR register received over several scan chains. If this register fails, then many bits will be flipped and accordingly a burst of failing bits can be stored with a single offset value of its beginning within the overall receive stream (see paragraph above). Similarly, the USB-DFT could buffer and burst-out data from an individual scan-chain. Also, the USB-DFT may keep results of a single block coming from several scan chains buffered and bursted out separately from the results of another block.
   Beyond the individual error information, the streaming error detection block stores statistics relevant to the analysis of failure: e.g. counting the total number of failures, storing the byte-offset of the first failing cycle.
4. A unique feature of result processing of scan-over-HSIO is that an error may not only occur in the payload of scan output data, but also in the command code as well: e.g.
   a. the HSIO-Scan DFT noticed an abnormality that it communicates out hereby breaking the command sequence.
   b. HSIO-Scan DFT itself is broken, which typically invalidates all the payload.
   A solution to this would store an additional expect data set with each bit describing whether its correspondent receive data bit is a command: Command-Flag Data Whenever an error is detected in a command, a "Command Error" flag is raised to qualify the result and speeds up the detection of unexpected process issues. Whenever such an error occurs, the streaming error detection block may switch into a mode minimizing the storage of useless and random payload data or possibly capturing the following bits as information payload on the state of the HSIO-Scan DFT block.
5. Beyond efficiently detecting that an error occurred and storing the result, streaming result processing may descramble the results such that the error map is not based on the bit-offset of the scan data packed into the serial USB stream with its command structure but directly refers to offsets of the block-IO: e.g. offsets into a scan-chain.
   The descrambling requires mapping information that need to be stored with the scan pattern as "annotations". It could be merged with the Command Flag Data to filter-out command data which are inherently irrelevant vs. the scan IO of a tested SOC-block.
   Furthermore, the mapping information may be different once receive data of different SOC-blocks are communicated. Accordingly, the descrambling process may first detect the payload type (e.g. stored in a block index of a command) before applying the correct descrambling map: e.g. how each bit in the payload maps to scan-chains—possibly, repeated for a long burst of payload.
   In total the flow of streaming descrambling can be split into three phases that could be sequenced in an effective implementation:
   a. Discarding command-data
   b. Detecting payload type. This stage may also handle repeats of identically structured payload coded into a single command-frame
   c. Descrambling payload with applicable mapping Aspect 3: Solution for Reducing Required Test Data Volume Issue: Test Data Volume is escalating. This impacts storage as well as required bandwidth in memory access and multi-site data streaming Solution:

Mask Data as well as Command-Flag Data may be compressed with algorithms that allow real-time decompression just before the actual compare with receive data.

Since mask bits should be rare and more likely to be bursted, run-length encoding may be effective and simple to decode.

Command-Flag Data may be run-length encoded or algorithmically compressed: e.g. if a receive word is split into command and payload bits.

Aspect 4: Solution for Reducing the Time-Overhead of Sequencing Commands

Issue: HSIO-Scan testing is surrounded by other actions: e.g. to setup the device before HSIO-Scan, to change test conditions between HSIO-Scan tests or to burst independent HSIO-Scan pattern tests. In all these cases the sequential execution of actions leads to overhead.

In a typical ATE this is minimized or entirely avoided by preparing the test data of the following action in FIFOs such that testing can continue without a break.

Solution:

Actions controlling HSIO-Scan generally require support by the software-stack in a high-level operating system. Accordingly, preparing the test data of the following action requires parallel start of OS-level activities before the completion of the prior ones. This can be done by multi-threading, typically available by a state-of-the-art operating system (e.g. Linux). However, the activities at the DUT Interface have to be in order. Accordingly, transmitting of the USB data has to be paused until prior action is completed.

Pausing the HSIO-Scan data transmission requires interference with the protocol stack of the specific HSIO port: e.g. For PCIe: The PCIe may continue driving IDLE until the prepared frames can be started. If it's a DMA access from the DUT, then the PCIe could be fully prepared and just waiting until the DUT engages in the DMA data transfer after the prior actions is complete Pausing the data transmission requires appropriate changes of the HSIO stack in the HSIO IP: e.g. the HSIO may have two Pipelines preparing transmissions. Every time one of them stays armed/gated until a trigger is received to release the data transmission in the next available slot. The trigger may either be a low-level software command or an electrical trigger received from another instrument or even the DUT itself.

Aspect 5: Solution for Keeping Test Setup, Test Data and Test Data Flow Decoupled from HSIO Port Specifics Issue: HSIO interfaces are programmed in various ways on different operating systems and with varying drivers. Typical variations the test equipment will need to support include but are not limited to:

Varying HSIO ports including USB, PCIe, 1149.10 or even proprietary interfaces

HSIO operated as host/root or as end-point

ATE actively streaming test data to the DUT or DUT pulling data from ATE (DMA)

HSIO communication through standard interfaces or requiring a custom driver

However, ATE and test programs need to enable generic, configurable test setups and use-cases.

Solution:

The ATE solution allows reconfiguring the Port-Interface within a test program: e.g. from PCIe Endpoint to 1149.10 test interface.

The ATE software supports 2 or more generic use-models enabled by a virtual "Instrument" that can apply to one or more HSIO types: e.g.

Push-mode—streaming (typical for USB, 1149.10): the ATE actively pushes the stimulus data into the HSIO comm's DMA-mode (typical for PCIe): The DUT maps the OCST memory into its memory space and reads data from/to it.

Adding hooks within the system to enable the customer or a $3^{rd}$ party to adjust the standard block according to the proprietary interface: e.g.

define a standard Interface for implementing a custom port according to a selected use-model: e.g. DMA.

efficient custom/3rd party code running on the OCST card to analyze the received packages for yield learning. In this case the Expect Data may contain supporting information rather than direct comparable expect data.

Per-DUT Encryption just before pushing the data into the HSIO.

Allow per-site mapping of addresses used by the DUT writing results in DMA-Mode. This will keep the physical receive memory distinct even if the DMAs of each site are identical.

CONCLUSIONS

To conclude, the embodiments described herein can optionally be supplemented by any of the important points or aspects described here. However, it is noted that the important points and aspects described here can either be used individually or in combination and can be introduced into any of the embodiments described herein, both individually and in combination.

IMPLEMENTATION ALTERNATIVES

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An automated test equipment for testing one or more devices under test, the automated test equipment comprising:
   at least one port processing unit, comprising:
      a high-speed-input-output interface (HSIO) for coupling with at least one of the one or more devices under test;
      a memory for storing data received from one or more coupled devices under test; and
      a streaming error detection block configured to detect a command error in data received from the one or more coupled devices under test,
   wherein the port processing unit is configured to: responsive to a detection of the command error, limit the storing into the memory of data received following a command that caused the detection of the command error.

2. The automated test equipment according to claim 1, wherein the port processing unit is further configured to prevent any further processing of data received from the one of more devices coupled devices under test subsequent to the command error.

3. The automated test equipment according to claim 1, wherein a limitation on an amount of data received and stored in the memory subsequent to the command error is based on one of a fixed value, a variable value and a dynamic value.

4. The automated test equipment according to claim 1, wherein the streaming error detection block is further configured to compare data received from the one or more coupled devices under test with pre-loaded expected data.

5. The automated test equipment according to claim 4, wherein the expected data comprises mask data.

6. The automated test equipment according to claim 4, wherein the streaming error detection block is further configured to pre-load the expected data into a per-device first-in-first-out (FIFO) memory associated with a respective one or more coupled devices under test, wherein the FIFO memory is configured to track data usage by the respective one or more coupled devices and to discard data that has been previously compared.

7. The automated test equipment according to claim 6, wherein the at least one port processing unit is configured to recognize a certain device under test as failing in response to finding, based on tracked data usage, that the certain device under test does not follow a particular data pattern.

8. The automated test equipment according to claim 4, wherein the streaming error detection block is further configured to: responsive to a determination that the data received is a deterministic stream of bytes, compare the data received and the pre-loaded expected data in an order of loading of the pre-loaded expected data; and responsive to a determination that the data received is received with associated an address information, compare the data received with expected data at a memory address corresponding to the address information.

9. The automated test equipment according to claim 4, wherein the pre-loaded expected data comprises command data bits indicating whether corresponding received data bits correspond to a command.

10. The automated test equipment according to claim 9, wherein the command data bits comprise mapping information, and wherein the port processing unit is further configured to: descramble the data received based on the mapping information to obtain error information, wherein the error information comprises an error map including offset information, and wherein the offset information references to the stored data.

11. The automated test equipment according to claim 4, wherein the pre-loaded expected data comprises mask data, wherein the mask data is operable to indicate which bits of the data received are expected to be command bits.

12. The automated test equipment according to claim 1, wherein the streaming error detection block is further configured to: detect payload data errors in the data received; and selectively store data into the memory in response to a detection of a payload data error in the data received.

13. The automated test equipment according to claim 1, wherein the memory is configured to store data in a compressed representation, wherein a compression function associated with the compressed representation is based on standard data compression or a compression associated with a test specific format.

14. The automated test equipment according to claim 13, wherein the at least one port processing unit is further configured to dynamically adjust the compression function to match an expected error distribution.

15. The automated test equipment according to claim 13, wherein the at least one port processing unit is configured to keep data received that is likely failing within proximity in a received data stream.

16. The automated test equipment according to claim 1, wherein the streaming error detection block is further configured to store statistical information that is relevant to performing a failure analysis.

17. The automated test equipment according claim 1, wherein the streaming error detection block is further configured to detect the command error in response to a determination that a device under test has broken a command sequence.

18. The automated test equipment according to claim 1, wherein the at least one port processing unit is configured to set a command error flag in response to a detection of the command error.

19. The automated test equipment according to claim 1, wherein mapping information is stored in the memory, and wherein the port processing unit is further configured to: descramble the data received based on the mapping information to obtain error information, wherein the error information comprises an error map including offset information, and wherein the offset information references to the stored data.

20. The automated test equipment according to claim 19, wherein the mapping information is different for each device under test, and wherein the port processing unit is further configured to detect a payload type of the data received prior to descrambling thereof.

21. The automated test equipment according to claim 20, wherein the port processing unit is further configured to discard command data prior to detecting the payload type of the data received.

22. A method for automated testing of devices under test, the method comprising:
receiving data, via a high-speed-input-output (HSIO) interface connecting a port processing unit with at least one of the devices under test;
storing the data received from connected devices under test in a memory;
detecting a command error in the received data stored in the memory; and
responsive to a detection of the command error, limiting the storing of the data in the memory following a command that caused the detection of the command error.

23. A non-transitory computer-readable medium having computer-readable program code embodied therein for causing a computer system to perform a method for automated testing of devices under test, the method comprising:
receiving data, via a high-speed-input-output (HSIO) interface connecting a port processing unit with at least one of the devices under test;
storing the data received from connected devices under test in a memory;
detecting a command error in the data stored in the memory; and
responsive to a detection of the command error, limiting the storing of the data in the memory following a command that caused the detection of the command error.

* * * * *